United States Patent [19]

Posedel

[11] Patent Number: 5,006,769
[45] Date of Patent: Apr. 9, 1991

[54] ARRANGEMENT FOR DETECTING WINDING SHORTS IN THE ROTOR WINDING OF ELECTRICAL MACHINES

[75] Inventor: Zlatimir Posedel, Neuenhof, Switzerland

[73] Assignee: Asea Brown Boveri Ltd., Baden, Switzerland

[21] Appl. No.: 497,720

[22] Filed: Mar. 23, 1990

[30] Foreign Application Priority Data

Apr. 5, 1989 [CH] Switzerland .................. 1264/89

[51] Int. Cl.[5] .............................................. H02H 7/08
[52] U.S. Cl. .................................. 318/434; 361/33
[58] Field of Search ...................... 361/42–50, 361/23, 24, 82, 30, 31, 33, 63, 85, 80, 86, 87, 88, 93, 95; 318/432, 434, 798, 802, 806, 807, 812, 773, 827

[56] References Cited

U.S. PATENT DOCUMENTS

| | | | |
|---|---|---|---|
| 3,297,738 | 10/1981 | Lee | 361/42 |
| 4,079,435 | 3/1978 | Zaslauskaya et al. | 361/82 |
| 4,144,470 | 3/1979 | Auinger | 318/773 X |
| 4,204,237 | 5/1980 | Zocholl | 361/87 X |
| 4,224,652 | 9/1980 | Fiorentzis | 361/42 |
| 4,695,776 | 9/1987 | Dishner et al. | 318/14 |
| 4,704,653 | 11/1987 | Li | 361/95 |
| 4,761,703 | 8/1988 | Kliman et al. | 318/806 X |
| 4,772,978 | 9/1988 | Oura et al. | 361/80 X |
| 4,851,782 | 7/1989 | Jeerings et al. | 361/85 X |

FOREIGN PATENT DOCUMENTS 2034883 7/1970 Fed. Rep. of Germany .
2096770 10/1982 United Kingdom .

OTHER PUBLICATIONS

J. W. Wood et al., IEE Proceedings, vol. 133, Pt. B, No. 3, May 1986 Rotor Winding Short Detection, pp. 181–189.

Primary Examiner—William M. Shoop, Jr.
Assistant Examiner—A. Jonathan Wysocki
Attorney, Agent, or Firm—Oblon, Spivak, McClelland, Maier & Neustadt

[57] ABSTRACT

An arrangement for detecting winding shorts in a rotor winding of an electrical machine having a drive shaft with a drive end directly connected to ground and a measuring element provided at the non-drive end of the drive shaft for recording the shaft voltage between the machine shaft and ground. The voltage measuring element produces an output corresponding to the shaft voltage, which is applied to an analysis unit. The analysis unit evaluates the even or fractional harmonic content of the shaft voltage and outputs an alarm signal in the event that the even or fractional harmonic content exceeds a predetermined value.

4 Claims, 5 Drawing Sheets

$f(x) \neq -f(x+\pi)$ $f(x) = -f(x+\pi)$ $f(x) \neq -f(x+\pi)$ $f(x) = -f(x + \pi)$ $f(x) \neq -f(x + \pi)$

ARRANGEMENT FOR DETECTING WINDING SHORTS IN THE ROTOR WINDING OF ELECTRICAL MACHINES

BACKGROUND OF THE INVENTION

1. Field of the Invention

The invention concerns an arrangement for detecting winding shorts in the rotor winding of electrical machines by analyzing shaft voltages or shaft currents.

The invention relates to the state of the art as given, for example, in the paper "Rotor winding short detection" in "IEE Proceedings", Vol. 133, Pt. B, No. 3, May 1986, pp. 181-189.

2. Discussion of Background

A winding short in the rotor winding of an electrical machine causes an asymmetrical current distribution between the generator poles. As a consequence of this winding short, the following effects occur
asymmetric heating of the rotor
forces due to the radial magnetic asymmetry
winding currents in the stator parallel conductors
magnetization of the shaft due to axial magnetic asymmetry.

The importance of detecting rotor winding shorts in good time, and of repairing the winding short, increases with the size of the machine.

Experience has shown that winding shorts can lead to serious faults if the operational constellation is critical.

Three main measurement methods can be used to identify winding shorts during operation and to observe their change with time:

Detecting the winding short by measuring the asymmetry of the stray magnetic field by means of a measurement coil installed in the air gap of the machine (near the rotor surface). The stray magnetic field is directly proportional to the ampere-turns in a groove.

Detecting the winding short during operation by measuring the winding currents in the stator parallel conductors. If there is rotor magnetic asymmetry due to the winding short, different voltage components are induced in the stator parallel conductors.

Detecting the winding short by subjecting the rotor winding to voltage pulses and analyzing the variation with time of the impulse waves.

These and other measurement methods are described in the paper "Rotor winding short detection" in IEE Proceedings, Vol. 133, Pt. B, No. 3, May 1986, pp. 181-189.

The method using a measurement probe in the air gap involves intrinsic dangers, demands an expensive design solution and requires relatively complicated analysis of the measurement signals. The second method also requires a design solution, for the application of the two high-tension-insulated measurement coils (Rogowski coils) wound around the stator conductors, and harmonic analysis of the stator current.

This method is questionable for machines already in operation.

SUMMARY OF THE INVENTION

Accordingly, one object of this invention is to provide, on the basis of the known art, a novel arrangement for detecting winding shorts in the rotor winding of electrical machines, the arrangement being operationally reliable, requiring no design arrangements in the machine and being usable both for permanent monitoring, as part of the general monitoring, and also for ad hoc diagnosis.

This object is achieved in the invention by directly grounding the machine shaft at the drive end, by providing a voltage measurement element at the nondrive end for recording the shaft voltage between the machine shaft and ground and by analyzing the even or fractional harmonics produced in the shaft voltage due to winding shorts.

The arrangement for determining winding shorts in operation is based on the fact that a rotor winding short induces even and fractional harmonics in the shaft voltages, these harmonics satisfying the following relationship:

$$(n\pm 1)*f/p,$$

where p is the number of pairs of poles in the machine and n=p, 3p, 5p ... etc.

In a generator without a rotor winding short, the magnetic flux of the poles is symmetrical. An eccentric bearing arrangement (static eccentricity) mainly causes a shaft longitudinal voltage between the machine shaft and ground which, however, contains only odd harmonics.

In the case of a winding short in the rotor winding, an alternating voltage occurs along the shaft of the generator (shaft longitudinal voltage) and this voltage also induces the even or fractional harmonics relative to the wave. On the basis of this relationship, the new arrangement determines the appearance of a winding short by measuring the even or fractional harmonics of the shaft longitudinal voltage.

Although dynamic eccentricity of the machine also induces even harmonics in the shaft voltage, the magnitude and spectral distribution is different from those components which occur in the case of winding shorts.

Relative to existing methods of recognizing rotor winding shorts, the invention has the great advantage that it can be connected to all machines already in operation, permanently for monitoring purposes and also from time to time for carrying out diagnoses, because it requires no constructional arrangements in the machine.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
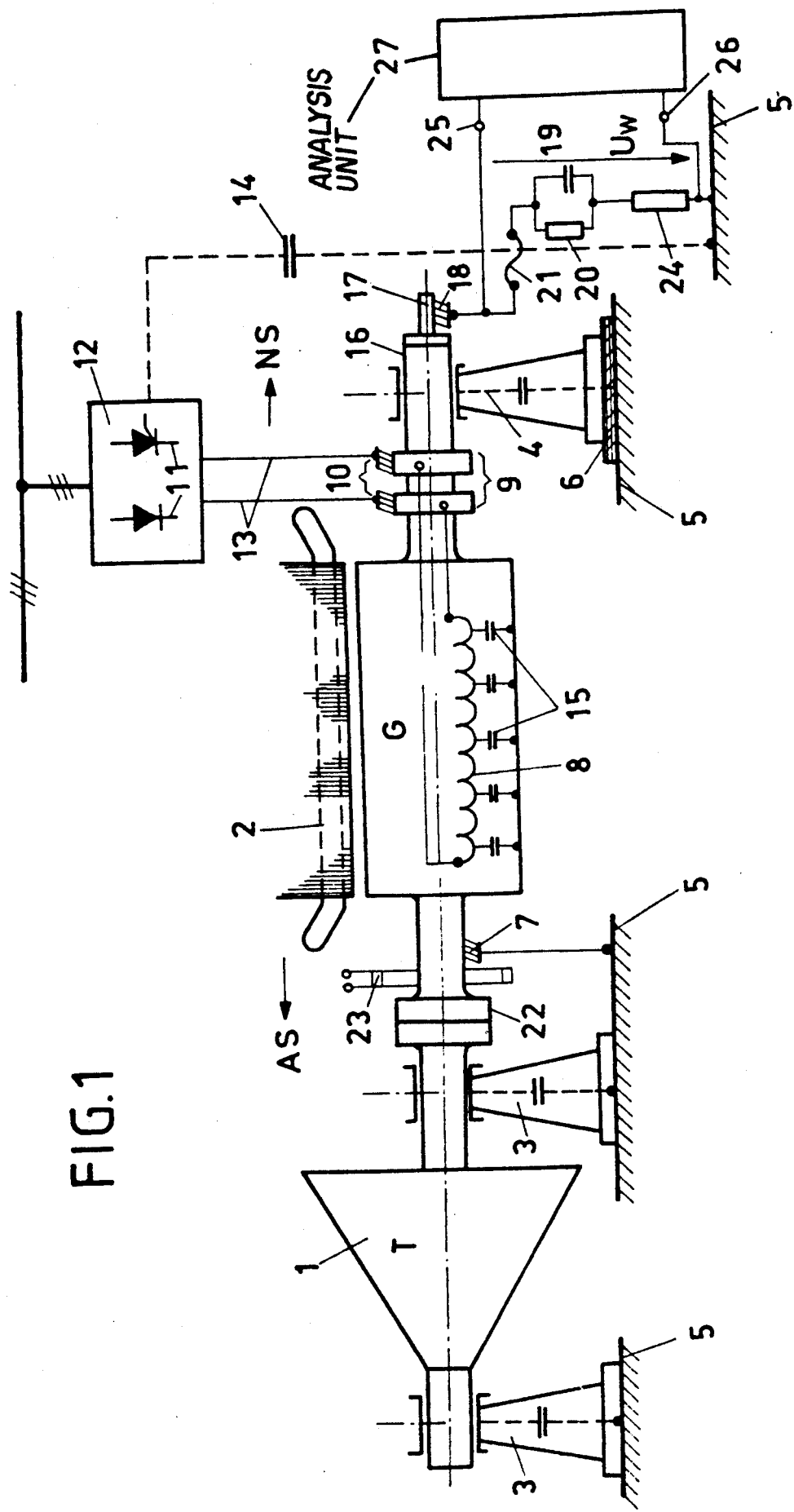
FIG. 1 shows a very diagrammatic representation of a turbo-group with an arrangement for detecting winding shorts in the rotor winding.

Referring now to the drawings, wherein like reference numerals designate identical or corresponding parts throughout the several views, FIG. 1 shows a turbo-group with a turbine 1 and a generator 2. A different electrical machine, e.g. a slip-ring rotor asynchronous motor instead of the generator 2 is conceivable, as is a prime mover with arbitrary drive instead of the turbine 1. The shafting bearings at the drive end (DE), which are not insulated relative to ground 5, are indicated by 3 and 4 is the bearing located at the non-drive end (NE), which is insulated from ground 5 by means of bearing insulation 6. The line of shafts is ohmically grounded at the drive end by means of an grounding brush 7. The rotor winding 8 is supplied via slip rings 9 and current extraction brushes 10 from the static supply system 12, i.e. one equipped with semiconductor rectifiers 11 (only shown symbolically), via leads 13.

A measurement device for the shaft voltage is provided at the non-drive end, or the shaft end 16 at which the bearings (sealing rings etc.) are insulated relative to ground 5 by means of the insulation paths 6. The shaft voltage is picked up, in the simplest case, by means of brushes 18. In the case of a machine with grounding via an RC element at the non-drive end, as is shown in the example, the shaft voltage can be taken directly between the brush 18 and ground 5. Grounding in this case consists of a sliding contact with a rotating contact part on a shaft trunnion 17 and a fixed contact, the brushes 18, a condenser 19 and an ohmic resistance 20 connected in parallel with it. A fuse 21 connected in series with the RC element 19, 20 has the duty of preventing a flow of currents in the case of an insulation defect in the ohmic resistance or the capacity. In this case, these currents would be driven by low-frequency longitudinal voltages. For this purpose, it is preferable to employ slow-blow fuses with the smallest possible breaking currents; these, however, do not respond to the very short-period capacitive discharge currents. The following criteria apply to the design of the condenser 19 and the ohmic resistance 20:

This grounding arrangement should, on the one hand, provide the lowest possible impedance to the discharge of the steep voltage peaks and, on the other hand, the current caused by low-frequency shaft voltage components (rotational frequency and higher harmonics) in the case of a contact being present at the other end —drive end—has to be small; resistance values between 400 and 1000 Ohm and capacity values of between 1 and 30 microfarad have been found to be particularly useful.

Figure 5:
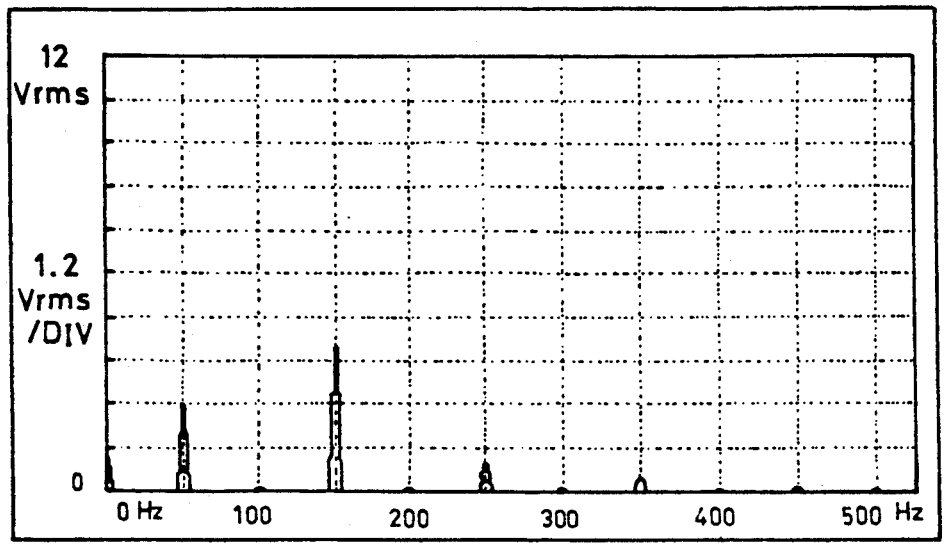
FIG. 5 shows a diagram, which shows the harmonic analysis of the shaft voltage of a two-pole turbo-generator without winding short.

The following requirements must be satisfied by the sliding contact in the discharge circuit at the non-drive end:

a small sliding speed which can, for example, be achieved by a shaft trunnion 17 whose diameter is smaller than that of the shaft;

a rotating contact part surface favorably structured for the discharge of short current pulses, e.g. by structuring the trunnion surface, preferably as shown in FIG. 5 of DE-OS 3,511,755;

brushes with constant mechanical and electrical properties, e.g. ones made of metallized carbon filters or metal and which are in contact with the shaft trunnion 17 either radially or axially.

Figure 7:
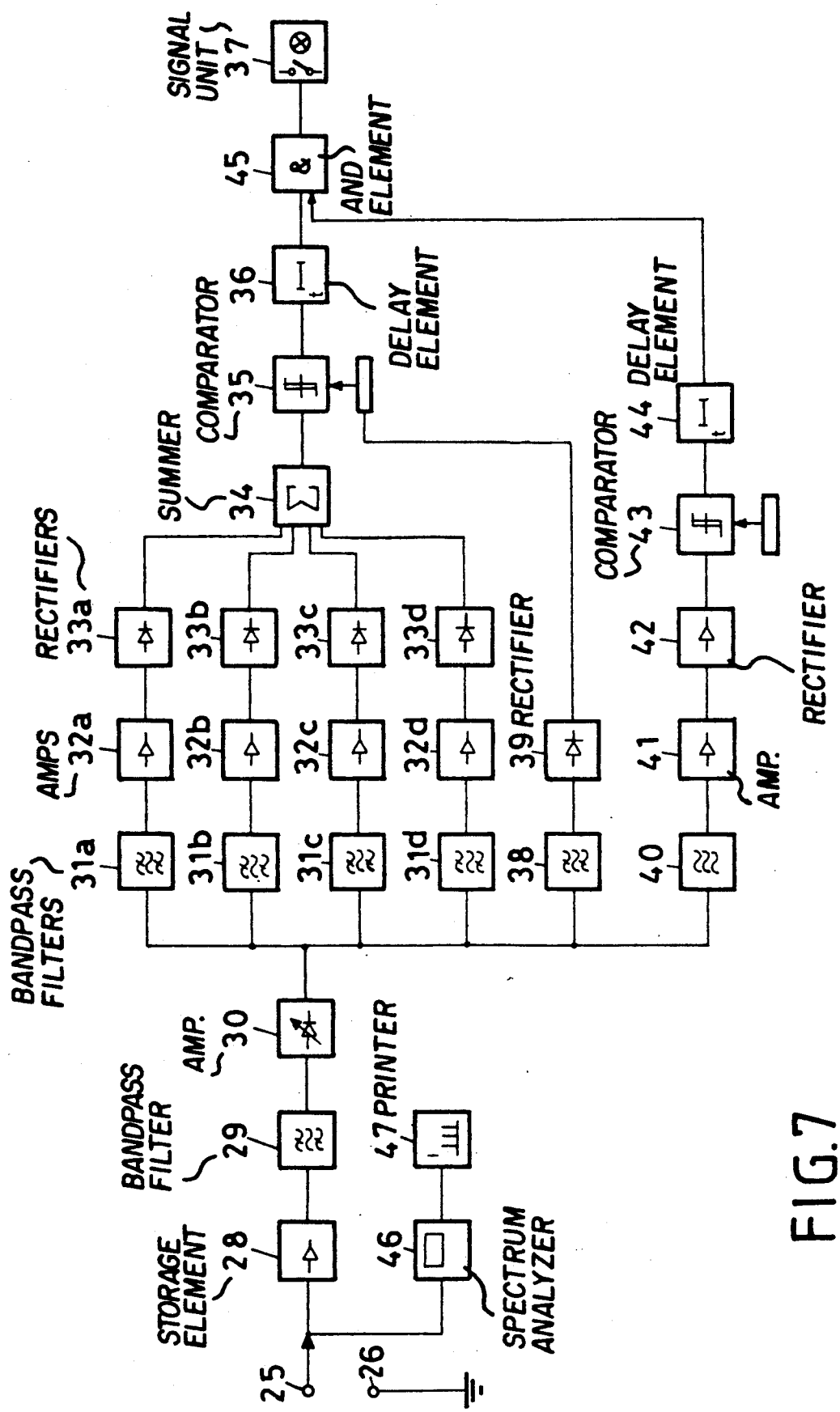
FIG. 7 shows the block circuit diagram of the arrangement for monitoring winding shorts.

In series with the RC element 19, 20, there is also a low induction measurement resistance (shunt) 24 for determining the total shaft discharge current which flows to ground from the non-drive end. An analysis unit 27, whose structure is given in FIG. 7, is connected by means of terminals 25, 26 which lead directly to the brushes 18, the connecting point between the RC element 20, 19 and the measurement resistance and ground (foundation 5).

A current transformer, preferably a Rogowski coil 23, surrounding the shaft between the drive end grounding brush 7 and the coupling 22 is also used for recording the shaft current and can be fed to a monitoring device.

Figure 2:
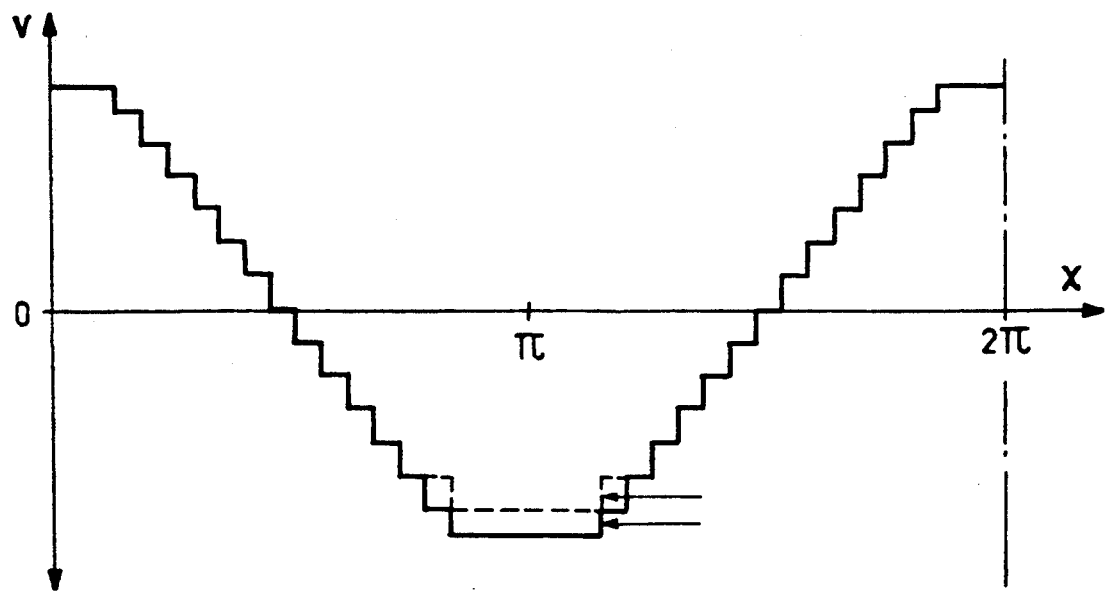
FIG. 2 shows a diagram illustrating the flux through the rotor of a two-pole turbo-generator with and without coil short.

The principle of the rotor winding short monitoring is based on appropriate analysis of the harmonics of the shaft voltage occurring during operation. In the case of a rotor which has no winding shorts, the distribution of the ampere turns at the periphery of the rotor is symmetrical and the rotor field of the machine only has odd harmonics. When a winding short occurs in the rotor winding of a turbo-generator, an asymmetry appears in the peripheral distribution of the ampere turns (FIG. 2—full line curve without winding short, dotted curve with winding short)

$$v(x+)-v(x)$$

and the rotor field of the machine also contains even harmonics. A shaft longitudinal voltage appears which, in the case of a rotor with a winding short, has even harmonics—due to the radial magnetic asymmetry of the machine, mainly caused by rotor static eccentricity.

Figure 3:
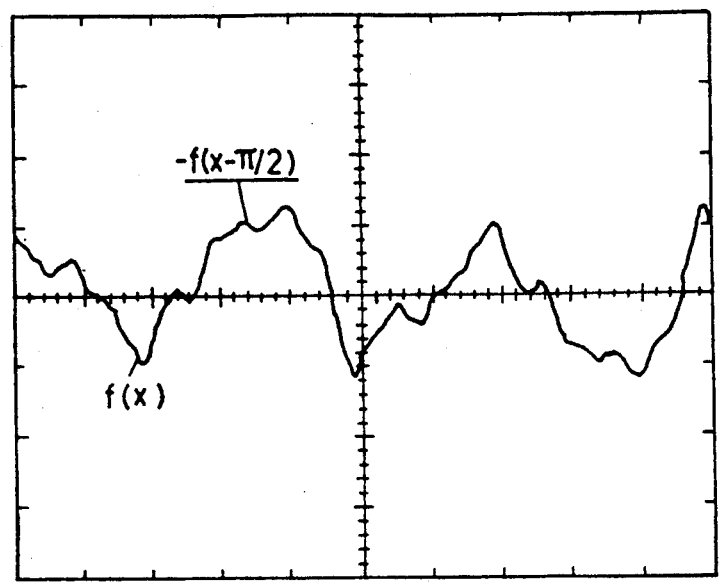
FIG. 3 shows a diagram to illustrate the shaft longitudinal voltage of a two-pole turbo-generator without winding short.
Figure 4:
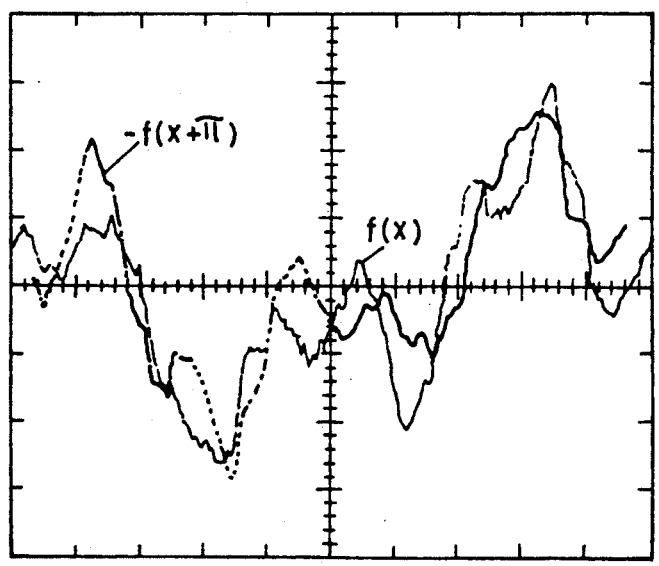
FIG. 4 shows a diagram to illustrate the shaft longitudinal voltage of a two-pole turbo-generator with winding short.

The curves of the shaft longitudinal voltage of a two-pole turbo-generator without winding short (FIG. 3) and with winding short (FIG. 4) are compared in FIGS. 3 and 4.

Figure 6:
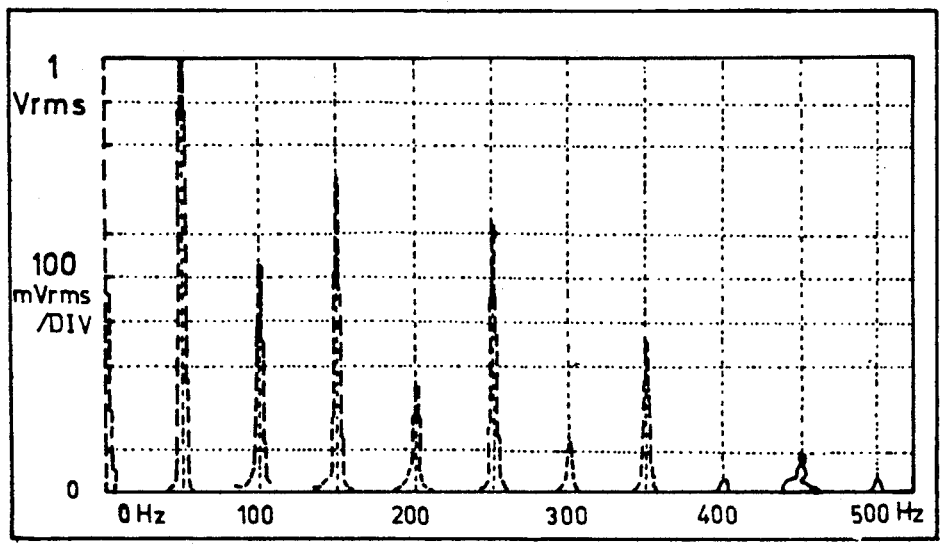
FIG. 6 shows a diagram, which shows the harmonic analysis of the shaft voltage of a two-pole turbo-generator with winding short.

Amplitude analysis of the even harmonics permits a conclusion on the presence of the winding short in the rotor winding of the turbo-generator (FIGS. 5 and 6).

FIG. 7 shows the analysis unit 27 of FIG. 1 in the form of a block circuit diagram.

The input signal $U_w$ present at the terminals 25 and 26 is stored and amplified in a storage element 28 and is then conducted further via a band filter 29 and an amplifier 30, with adjustable amplification, to parallel band filters 31a, 31b, 31c and 31d. Each band filter is tuned to an even harmonic of the fundamental frequency of the shaft voltage. In the case of a two-pole 50 Hz machine (number of pairs of poles p=1), the band filters 31a, 31b, 31c and 31d are therefore tuned to the even harmonics 100 Hz, 200 Hz, 300 Hz and 400 Hz. In the case of a four-pole machine (number of pairs of poles p=2), the band filters are correspondingly tuned to the fractional harmonics 25 Hz, 75 Hz, 125 Hz and 175 Hz. Each of these harmonics receives narrow band amplification in the subsequent amplifiers 32a, 32b, 32c and 32d and is then rectified in rectifiers 33a, 33b, 33c and 33d. All the even and fractional harmonics are fed, after summation in a summation element 34, to a voltage comparator 35 for analysis.

If the sum of the even harmonics exceeds the level set, an alarm is given, via a delay relay 36, at a signal unit 37. The value of the level set depends on the total shaft voltage magnitude, which is recorded by means of a wide-band filter 38 and a rectifier 39. An analysis of amplitudes between harmonics in an auxiliary path, consisting of a filter with band-pass characteristic 40, amplifier 41, rectifier 42, voltage comparator 43 and delay relay 44, prevents erroneous interpretation by locking the alarm signal in the AND element 45 in the case of poor measurement or grounding brush contact. The filter 40 is tuned to about 75 Hz in the case of a two-pole machine and to about 100 Hz in the case of a four-pole machine.

The hardware requirements are drastically reduced if the shaft voltage analysis shown is replaced by a microprocessor.

The output unit 37 can, if required, be replaced by a suitable modem.

A deeper analysis of the shaft voltage is possible by including a spectrum analyzer 46, with a printer 47 connected to it, at the signal input of the monitoring unit.

Obviously, numerous modifications and variations of the present invention are possible in light of the above teachings. It is therefore to be understood that within the scope of the appended claims, the invention may be practised otherwise than as specifically described herein.

What is claimed as new and desired to be secured by Letters Patent of the United States is:

1. Arrangement for detecting winding shorts in a rotor winding of an electrical machine having a drive shaft, comprising:

said drive shaft having a drive end which is directly grounded and a non-drive end;

a voltage measuring element provided at the non-drive end for recording a shaft voltage between the machine shaft and ground; and an analysis unit coupled to said voltage measuring element and receiving said shaft voltage for evaluating at least one of even and fractional harmonics produced in the shaft voltage and producing an output signal when the content of said at least one of said even and fractional harmonics exceed a predetermined value.

2. Arrangement as claimed in claim 1, wherein the analysis unit comprises parallel-connected band-pass filters which are tuned to said at least one of said even and fractional harmonics of the shaft voltage and which each have an output signal.

3. Arrangement as claimed in claim 2, wherein the analysis unit further comprises:

a summation element connected to the band pass filters and having applied thereto the band pass filter output signals for summing said output signals, and producing a summation signal; and comparing means for comparing the summation signal with a reference signal.

4. Arrangement as claimed in claim 3, wherein the analysis unit comprises:

an auxiliary path for recording non-harmonic components of the shaft voltage signal in order to lock the output signal of said analysis unit in the case of contact problems at at least one of the drive end and the non-drive end of said drive shaft.

* * * * *